(12) United States Patent
Carlough et al.

(10) Patent No.: US 11,587,600 B2
(45) Date of Patent: Feb. 21, 2023

(54) ADDRESS/COMMAND CHIP CONTROLLED DATA CHIP ADDRESS SEQUENCING FOR A DISTRIBUTED MEMORY BUFFER SYSTEM

(71) Applicant: International Business Machines Corporation, Armonk, NY (US)

(72) Inventors: Steven R. Carlough, Poughkeepsie, NY (US); Susan M. Eickhoff, Hopewell Junction, NY (US); Warren E. Maule, Cedar Park, TX (US); Patrick J. Meaney, Poughkeepsie, NY (US); Stephen J. Powell, Austin, TX (US); Gary A. Van Huben, Poughkeepsie, NY (US); Jie Zheng, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 621 days.

(21) Appl. No.: 16/397,154

(22) Filed: Apr. 29, 2019

(65) Prior Publication Data
US 2019/0252010 A1 Aug. 15, 2019

Related U.S. Application Data

(62) Division of application No. 15/825,894, filed on Nov. 29, 2017, now Pat. No. 10,395,698.

(51) Int. Cl.
*G11C 11/00* (2006.01)
*G11C 7/10* (2006.01)
(Continued)

(52) U.S. Cl.
CPC ............ *G11C 7/109* (2013.01); *G06F 3/0611* (2013.01); *G06F 3/0626* (2013.01);
(Continued)

(58) Field of Classification Search
CPC ......... G11C 7/109; G11C 5/04; G11C 7/1003; G11C 7/1078; G11C 7/22; G06F 3/0611;
(Continued)

(56) References Cited

U.S. PATENT DOCUMENTS 5,815,723 A   9/1998   Wilkinson et al.
6,104,751 A   8/2000   Artieri
(Continued)

FOREIGN PATENT DOCUMENTS

CN   101099140 A   1/2008
CN   105553636 A   5/2016
(Continued)

OTHER PUBLICATIONS

Office Action dated Aug. 18, 2020 received in U.S. Appl. No. 16/598,103, 25 pages.
(Continued)

*Primary Examiner* — Pho M Luu
(74) *Attorney, Agent, or Firm* — Scully, Scott, Murphy & Presser, P.C.

(57) ABSTRACT

One or more memory systems, architectural structures, and/or methods of storing information in memory devices is disclosed to improve the data bandwidth and or to reduce the load on the communication links. The system may include one or more memory devices, one or more memory control circuits and one or more data buffer circuits. The memory system, architectural structure and/or method improves the ability of the communications links to transfer data downstream to the data buffer circuits. The memory control circuit receives a store command and a store data tag (Host tag) from a Host and sends the store data command and the store data tag to the data buffer circuits. No store data tag or control signal is sent over the communication links between the Host and the data buffer circuits, only data is sent over
(Continued)

the communication links between the Host and the data buffer circuits.

20 Claims, 6 Drawing Sheets

(51) Int. Cl.
    *G06F 3/06*         (2006.01)
    *G11C 5/04*         (2006.01)
    *G06F 12/08*        (2016.01)
    *G11C 7/22*         (2006.01)

(52) U.S. Cl.
    CPC .......... *G06F 3/0658* (2013.01); *G06F 3/0659* (2013.01); *G06F 3/0685* (2013.01); *G06F 12/08* (2013.01); *G11C 5/04* (2013.01); *G11C 7/1003* (2013.01); *G11C 7/1078* (2013.01); *G11C 7/22* (2013.01); *G11C 2207/2245* (2013.01)

(58) Field of Classification Search
    CPC .... G06F 3/0626; G06F 3/0658; G06F 6/0659; G06F 3/0685
    See application file for complete search history.

(56) References Cited

U.S. PATENT DOCUMENTS

| | | | |
|---|---|---|---|
| 6,510,100 | B2 | 1/2003 | Grundon et al. |
| 6,757,800 | B1 * | 6/2004 | Estakhri ............... G11C 16/102 711/202 |
| 7,330,992 | B2 | 2/2008 | Jeddeloh et al. |
| 7,984,329 | B2 | 7/2011 | Lastras-Montano et al. |
| 8,180,931 | B2 | 5/2012 | Lee et al. |
| 8,612,684 | B2 | 12/2013 | Briggs et al. |
| 8,788,747 | B2 | 7/2014 | Ahn et al. |
| 9,146,864 | B2 | 9/2015 | Retter et al. |
| 9,170,753 | B2 | 10/2015 | Chen et al. |
| 9,201,817 | B2 | 12/2015 | Chu et al. |
| 9,235,680 | B2 | 1/2016 | Rooyen et al. |
| 9,348,518 | B2 | 5/2016 | Fields, Jr. et al. |
| 9,430,418 | B2 | 8/2016 | Meaney et al. |
| 9,589,626 | B1 | 3/2017 | Liu et al. |
| 9,792,965 | B2 | 10/2017 | Best et al. |
| 9,836,415 | B2 * | 12/2017 | Shan ........................ G11C 7/10 |
| 10,223,299 | B2 | 3/2019 | Ware et al. |
| 10,395,698 | B2 | 8/2019 | Carlough et al. |
| 2001/0054121 | A1 | 12/2001 | Proch et al. |
| 2005/0177657 | A1 | 8/2005 | Pope et al. |
| 2006/0179213 | A1 | 8/2006 | Brittain et al. |
| 2007/0180186 | A1 * | 8/2007 | Cornwell ............... G06F 12/023 711/170 |
| 2011/0087808 | A1 | 4/2011 | Durand et al. |
| 2012/0233500 | A1 | 9/2012 | Roettgermann et al. |
| 2014/0281191 | A1 | 9/2014 | Retter et al. |
| 2015/0006841 | A1 | 1/2015 | Chen et al. |
| 2015/0160920 | A1 | 6/2015 | Bergkvist, Jr. et al. |
| 2015/0255130 | A1 | 9/2015 | Lee et al. |
| 2015/0261446 | A1 | 9/2015 | Lee |
| 2016/0092361 | A1 | 3/2016 | Grimsrud et al. |
| 2016/0328156 | A1 | 11/2016 | Swarbrick et al. |
| 2017/0109058 | A1 | 4/2017 | Shallal et al. |
| 2018/0181504 | A1 | 6/2018 | Morris et al. |
| 2019/0163362 | A1 | 5/2019 | Carlough et al. |
| 2019/0163378 | A1 | 5/2019 | Carlough et al. |
| 2019/0163384 | A1 | 5/2019 | Carlough et al. |

FOREIGN PATENT DOCUMENTS

| | | |
|---|---|---|
| JP | 2005092630 A | 4/2005 |
| JP | 2006221642 A | 8/2006 |
| JP | 2006313538 A | 11/2006 |
| WO | 2019106496 A1 | 6/2019 |

OTHER PUBLICATIONS

Office Action dated Nov. 2, 2021, received in a related U.S. Patent Application, namely U.S. Appl. No. 16/676,962.
Office Action dated Jan. 18, 2022 which was received in a U.S. Appl. No. 17/193,666, 28 pages.
Office Action dated Dec. 8, 2021 received from the United Kingdom Patent Office in a corresponding foreign application, 6 pages.
List of IBM Patents or Applications Treated as Related.
Office Action dated Apr. 19, 2019 issued in U.S. Appl. No. 15/825,867.
Office Action dated May 15, 2019 issued in U.S. Appl. No. 15/825,909.
Office Action dated Jul. 21, 2021 received in a related U.S. Patent Application, namely U.S. Appl. No. 16/676,962.
Examination Report dated Mar. 9, 2022 received from the United Kingdom Patent Office in a related foreign application, 3 pages.
Office Action dated Mar. 24, 2021 was received in U.S. Appl. No. 16/676,962.
List of IBM Patents or Patent Applications Treated as Related dated Apr. 23, 2021, 2 pages.
Hardware Engine (CCS) for Initialization and Test of DD R3 and DDR4 DRAMs; Jun. 6, 2013.
Siemens et al.; Buffer Device for Memory Modules (DIMM); Feb. 10, 2007.
IBM; Memory Controller and Protocol for Small-Granularity DRAM-access; May 8, 2009.
Hovis, W. P., Keller, P. R., Marcella, J. A. et al. (1995). Method for Reduction in Memory Requirements via Tag Bit Replication. IBM TDB, 38(4).
StratifyLabs, A FIFO Buffer Implementation, Oct. 2, 2013.
International Search Report and Written Opinion dated Mar. 11, 2019 issued in international application No. PCT/IB2018/059206.
Office Action dated Apr. 5, 2019 issued in U.S. Appl. No. 15/825,882.
English-language translation of a German Office Action dated Feb. 2, 2021 received in a corresponding foreign application, 9 pages.
English-language translation of the Japanese Office Action dated Feb. 15, 2022 received in a related foreign application, 2 pages.
Office Action dated Apr. 27, 2022 received in U.S. Appl. No. 16/676,962.

* cited by examiner

| BEAT | CA0 | CA1 | CA2 | CA3 | CA4 | CA5 | CA6 | CA7 |
|---|---|---|---|---|---|---|---|---|
| 1 | L0 | L1 | A0 | A1 | A2 | A3 | A4 | A5 |
| 2 | A6 | A7 | A8 | A9 | A10 | A11 | A12 | A13 |
| 3 | A14 | A15 | A16 | A17 | A18 | A19 | A20 | A21 |
| 4 | A22 | A23 | A24 | A25 | A26 | A27 | A28 | A29 |
| 5 | A30 | A31 | A32 | A33 | A34 | A35 | A36 | A37 |
| 6 | A38 | C0 | C1 | C2 | C3 | Q0 | Q1 | Q2 |
| 7 | Q3 | Q4 | Q5 | Q6 | ACK | P0 | P1 | P2 |
| 8 | P3 | P4 | P5 | P6 | P7 | P8 | P9 | P10 |

Fig. 5

| Memory Cycle 1 | | | Memory Cycle 3 | | | Memory Cycle 5 | | | Memory Cycle 7 | | | Memory Cycle 9 | | |
|---|---|---|---|---|---|---|---|---|---|---|---|---|---|---|
| Beat | RX0 | RX1 | Beat | RX0 | RX1 | Beat | RX0 | RX1 | Beat | RX0 | RX1 | Beat | RX0 | RX1 |
| 0 | D0 | D8 | 16 | D32 | D40 | 32 | D64 | D72 | 48 | D96 | D104 | 64 | CRC0 | CRC8 |
| 1 | D1 | D9 | 17 | D33 | D41 | 33 | D65 | D73 | 49 | D97 | D105 | 65 | CRC1 | CRC9 |
| 2 | D2 | D10 | 18 | D34 | D42 | 34 | D66 | D74 | 50 | D98 | D106 | 66 | CRC2 | CRC10 |
| 3 | D3 | D11 | 19 | D35 | D43 | 35 | D67 | D75 | 51 | D99 | D107 | 67 | CRC3 | CRC11 |
| 4 | D4 | D12 | 20 | O36 | D44 | 36 | O68 | D76 | 52 | D100 | D108 | 68 | CRC4 | CRC12 |
| 5 | D5 | D13 | 21 | D37 | D45 | 37 | D69 | D77 | 53 | D101 | D109 | 69 | CRC5 | CRC13 |
| 6 | D6 | D14 | 22 | D38 | D46 | 38 | D70 | D78 | 54 | O102 | D110 | 70 | CRC6 | CRC14 |
| 7 | D7 | D15 | 23 | D39 | D47 | 39 | D71 | O79 | 55 | O103 | D111 | 71 | CRC7 | CRC15 |
| Memory Cycle 2 | | | Memory Cycle 4 | | | Memory Cycle 6 | | | Memory Cycle 8 | | | | | |
| 8 | D16 | O24 | 24 | D48 | D56 | 40 | D80 | D88 | 56 | D112 | D120 | | | |
| 9 | D17 | D25 | 25 | D49 | D57 | 41 | D81 | D89 | 57 | D113 | D121 | | | |
| 10 | D18 | D26 | 26 | D50 | D58 | 42 | D82 | D90 | 58 | D114 | D122 | | | |
| 11 | O19 | D27 | 27 | D51 | D59 | 43 | D83 | D91 | 59 | D115 | O123 | | | |
| 12 | D20 | D28 | 28 | D52 | D60 | 44 | D84 | D92 | 60 | D116 | D124 | | | |
| 13 | D21 | D29 | 29 | D53 | D61 | 45 | D85 | D93 | 61 | D117 | D125 | | | |
| 14 | D22 | D30 | 30 | D54 | D62 | 46 | D86 | D94 | 62 | D118 | D126 | | | |
| 15 | D23 | D31 | 31 | D55 | D63 | 47 | D87 | O95 | 63 | D119 | D127 | | | |

Fig. 6

| Memory Cycle 1 | | Memory Cycle 2 | | Memory Cycle 3 | | Memory Cycle 4 | |
|---|---|---|---|---|---|---|---|
| Beat | CA | Beat | CA | Beat | CA | Beat | CA |
| 0 | T0 = 1 | 8 | Q6-op1 | 16 | R0-op1 | 24 | Reserved |
| 1 | T1 = 1 | 9 | Q0-op2 | 17 | R1-op1 | 25 | CRC0 |
| 2 | Q0-op1 | 10 | Q1-op2 | 18 | D0-op1 | 26 | CRC1 |
| 3 | Q1-op1 | 11 | Q2-op2 | 19 | D1-op1 | 27 | CRC2 |
| 4 | Q2-op1 | 12 | Q3-op2 | 20 | R0-op2 | 28 | CRC3 |
| 5 | Q3-op1 | 13 | Q4-op2 | 21 | R1-op2 | 29 | CRC4 |
| 6 | Q4-op1 | 14 | Q5-op2 | 22 | D0-op2 | 30 | CRC5 |
| 7 | Q5-op1 | 15 | Q6-op2 | 23 | D1-op2 | 31 | Ack |

Fig. 7

ADDRESS/COMMAND CHIP CONTROLLED DATA CHIP ADDRESS SEQUENCING FOR A DISTRIBUTED MEMORY BUFFER SYSTEM

CROSS-REFERENCE TO RELATED APPLICATIONS

This patent document is a divisional of, and claims priority to, U.S. patent application Ser. No. 15/825,894, filed Nov. 29, 2017, now U.S. Pat. No. 10,395,698. The disclosure of the priority application is fully incorporated by reference.

BACKGROUND

The present invention relates to memory systems and more particularly distributed buffer memory systems.

With recent advancement of information technology and wide use of the Internet to store and process information, more and more demands are placed on the acquisition, processing, storage and dissemination of information by computing systems. Computing systems are being developed to increase the speed at which the computers are able to execute increasingly complex applications for business, personal use, and entertainment. Overall computer system performance is affected by each of the key elements of the computer structure, including the performance/structure of the processors, any memory caches, input/output (I/O) subsystems, efficiency of the memory control functions, the performance of the memory devices and systems, and any associated memory interface elements, and the type and structure of the memory interconnect interfaces.

The constantly increasing speed of processors which execute increasingly complex applications places more rigorous performance demands on all of the other subsystems in the computer, including the memory subsystem, where data is stored, accessed, and updated numerous times during the operation of a software application. The time consumed by memory read/write operations is a major factor in the ultimate speed and efficiency of a computer system. The memory subsystem of most computers is normally operated by a memory controller. The task of memory controllers is to move data between the computer's memory subsystem and its one or more processors as quickly and efficiently as possible. A computer's memory subsystem often comprises memory modules, usually one or more dual in-line memory modules (DIMMs) that include several dynamic random access memory (DRAM) devices.

In many memory subsystems, a memory controller may control multiple memory channels, where each channel may include one or more Dual In-line Memory Modules (DIMMs), where the DIMMs may be arranged in one or more ranks. Computing demands require the ability to access an increasing number of higher density memory devices at faster and faster access speeds.

Extensive research and development efforts are invested by the industry to create improved and or innovative solutions to maximize overall system performance by improving the memory system/subsystem design and/or structure and the methods by which the memory system/subsystem operates. Such efforts have resulted in the development of distributed memory systems, distributed buffer memory systems, registered DIMMs (RDIMMs) and load reduced DIMMs (LRDIMMs), and other systems, specifications and standards such as, for example, DDR4 and DDR5, which provide for increased memory performance.

In one example, a distributed memory system may include a plurality of memory devices, one or more Address Chips (AC), also known as memory control circuits, and a plurality of data buffer or data (DC) circuits. There are communication links or buses between a Host processor and the memory control circuits and data buffer circuits. There is also a communication link or bus from the memory control circuits to the data buffer circuits. There are also communication links between the memory devices, e.g., DRAMS, and the memory control circuits and the data buffer circuits. Bandwidth limitations on communication links can affect performance of memory systems. The amount of data, command, control and response signals sent over communication links and busses between the Host, the memory control circuits, the data buffer circuits, and the memory devices, which includes the bandwidth allocated to transmit store data control functions, e.g., store data address tags and locations, impacts performance of memory systems.

SUMMARY

The summary of the disclosure is given to aid understanding of the memory system, architectural structure and method of storing and fetching data, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the memory systems, architectural structure and method of operation to achieve different effects.

A computer's memory subsystem often comprises memory modules, usually one or more dual in-line memory modules (DIMMs), which usually include a plurality of memory devices, e.g., dynamic random access memory (DRAM) devices. A distributed memory system may include a plurality of memory devices, e.g., DRAMS, which may be arranged on a module as a DIMM, one or more memory control circuits, and one or more data buffer circuits or data circuits. In one embodiment, the memory control circuit receives signals from a Host processor and outputs command and control signals. The memory control circuit may include a memory controller, and in one embodiment, may have a scheduler, which may be in the form of a circuit. The memory control circuit and/or memory controller in one embodiment may be remote from the Host processor, the data buffer circuits, and/or the memory devices. The memory control circuit, e.g., the scheduler, may optimize the order of operations and instructions, and sends out command signals (e.g., instructions) to the data buffer circuits and the memory devices. There are communication links or buses between the Host (e.g., processor), the memory control circuits, and the data buffer circuits, and/or the memory devices. In one embodiment, there is a communication bus or link from the memory control circuit to the data buffer circuits. In one embodiment there may also be communication buses and links between the Host and the memory control circuit, and separate communication buses or links between Host and the data buffer circuits. The memory system and/or architectural structure may further include a communication link or bus between the memory devices and the memory control circuit, and/or the data buffer circuit.

In one embodiment, a memory system, architectural structure, and/or method of storing information is disclosed to improve the data bandwidth between the Host and the data buffer circuits. In one embodiment, a memory system, architectural structure, and/or method to store write data in a data buffer circuit is described which improves the data bandwidth between the Host and data buffer circuit. In an embodiment, a memory system, architectural structure and/or method of storing information or data is disclosed where the Host sends the write buffer tag to the memory control circuit and the AC sends the write buffer tag to all the DC chips. In one embodiment the Host sends and only the memory control circuit receives from the Host the store data tag, and the Host sends the data to the data buffer circuits after a configurable or programmable delay. In an embodiment of a memory system, architectural structure, and/or method of storing data, the memory control circuit receives the store command from the Host and the memory control circuit sends a write-to-buffer command and store data tag to all the data buffer circuits, but no write to buffer tag is sent over the downstream link between the Host and the data buffer circuits. In one embodiment, the memory system, architectural structure and/or method of storing information and data includes a distributed memory system having a module containing a memory control circuit, a plurality of data buffer circuits, and a plurality of memory devices, and in one example may contain one AC chip, nine data chips, and a plurality of memory device chips arranged or organized in groups, preferably in groups of nine (e.g., 9, 18, 27, 36, etc.) or ten (e.g., 10, 20, 30, 40, etc.), preferably as a DIMM.

In one embodiment, a memory system for storing data in response to commands received from a Host is disclosed, the memory system comprising: a memory control circuit to receive commands from the Host and to output module command and control signals; at least one memory device configured to store data and receive command signals from the memory control circuit; at least one data buffer circuit associated with the at least one memory device; a communications link for communicating data between the Host and the at least one memory device, wherein the communications link includes a data communications link between the Host and the at least one data buffer circuit, and the at least one data buffer circuit and the at least one memory device, and only data is transmitted on the data communications link between the at least one data buffer circuit and the Host; and a control communications link between the memory control circuit and the at least one data buffer circuit, wherein the memory control circuit is configured to: (i) in response to receiving the Host store command, decode the store command into a write-to-buffer command and store-from-buffer command; and (ii) send the write-to-buffer command and a store data tag to the data buffer circuit over the control communications link, wherein the store data tag specifies the location to store the data into the at least one data buffer circuit. In one embodiment, no store data tag is sent to the at least one data buffer circuit over the communication link between the Host and the at least one data buffer circuit. In accordance with one aspect, the at least one data buffer circuit is configured to in response to receiving a write-to-buffer command, push incoming store data into the data buffer pointed to by the store data tag received from the memory control circuit. The incoming store data may be pushed into the at least one data buffer circuit after a configurable delay.

In one embodiment, the memory control circuit is configured to send a store command to the at least one memory device, the store command comprising a command and an address location to store the data in the memory devices. The memory control circuit preferably is further configured to send the store-from-buffer command along with store data tag to the at least one data buffer circuit. The store-from-buffer command and store data tag are sent to the at least one data buffer circuit in one configuration over a BCOM link between the memory control circuit and the data buffer circuit. The data buffer circuit may be further configured to pull store data from the data buffer location pointed to by the store data tag received from the memory control circuit over the control communications link and send the store data to the at least one memory device. The system in one aspect further comprises at least one module having the memory circuit formed on a single chip, a group of nine or ten data buffer circuits formed on separate chips and arranged on the module, and a plurality of memory devices arranged in groups of nine or ten chips on the module.

In accordance with another embodiment a memory system for reading and writing data to a memory device is disclosed, the system comprising: at least one memory control circuit to receive commands from a Host and to output command and control signals; at least one memory device configured to read and store data, and receive command signals from the memory control circuit; at least one data buffer circuit associated with the at least one memory control circuit; a data communications link for communicating data between the Host and the at least one memory device, wherein the data communications link includes a communications link between the Host and the at least one data buffer circuit, and the at least one data buffer circuit and the at least one memory device, and only data is transmitted on the communications link between the at one least data buffer circuit and the Host; and a control communications link between the at least one memory control circuit, the at least one memory device, and the at least one data buffer circuit for transmitting reading and writing operation signals of the memory system; wherein the at least one memory control circuit is configured to: (i) decode a store command into a write-to-buffer command and a store-from-buffer command; (ii) send the write-to-buffer command along with the store data tag to the at least one data buffer circuit; (iii) send a store command to the at least one memory device; and (iv) send the store-from-buffer command along with store data tag to the at least one data buffer circuit, and wherein the at least one data buffer circuit is configured to: (i) send incoming store data into a local data buffer pointed to by the local store data tag obtained by the memory control circuit; (ii) pull out store data from the local data buffer pointed to by store data tag received from the at least one memory control circuit; and (iii) send store data to the at least one memory device. In one aspect, the write-to-buffer command and the store data tag are configured to be sent to the data buffer circuit over the communication link between the memory control circuit and the data buffer circuit. The store data tag that is sent to the at least one data buffer circuit in one configuration is not sent over the data communications link between the Host and the at least one data buffer circuit.

The system according to one embodiment is configured to send the store-from-buffer command and store data tag to the data buffer circuit over the link between the memory control circuit and the at least one data buffer circuit. The system is preferably configured and adapted so that the at least one data buffer circuit receives its store data tag over the link between the memory control circuit and the at least data buffer circuit, and the store data is sent to the at least one memory device from the at least one data buffer circuit via the link between the at least one data buffer circuit and the at least one memory device.

In another aspect, a method for storing data in memory devices is disclosed, the method comprising: (i) obtaining a store command and store data tag from a host; (ii) processing the store command in a memory control circuit into a write-to-buffer command and a store-from-buffer command; (iii) sending the write-to-buffer command and a store data tag from the memory control circuit to at data buffer circuit; and (iv) pushing incoming data into the location in the data buffer circuit pointed to by the store data tag obtained from the memory control circuit. In accordance with another embodiment, the data buffer circuit pushes incoming data into the data buffer circuit upon receiving the write-to-buffer command. The data buffer circuit in one embodiment receives the data over the link between the host and the data buffer circuit, but no store data tag is received by the data buffer circuit from the host over the link between the host and the data buffer circuit. The method in one aspect further comprising sending a store command from the memory control circuit to the memory devices; sending the store-from-buffer command along with the store data tag to the data buffer circuit; and sending data from the location pointed to by the store data tag obtained from the memory control circuit to the memory devices. The data buffer circuit in a further aspect receives the data store tag over the link between the memory control circuit and the data buffer circuit. The method may further comprises the step of pushing the store data tag back to the host.

In yet another embodiment, a computer program product for storing data in a memory device is disclosed, the computer program product comprising a computer readable storage medium having program instructions embodied therewith, the program instructions executable by a memory system to cause the memory system to perform a method, the memory system preferably as described in connection with FIG. 4 comprising a memory control circuit, one or more data buffer circuits and a plurality of memory devices, the method comprising: (i) processing a store command in a memory control circuit into a write-to-buffer command and a store-from-buffer command; (ii) sending the write-to-buffer command and the local store data tag from the memory control circuit to the data buffer circuits and not sending any control signal to the data buffer circuits directly from the Host; and (iii) pushing incoming data into the location in the data buffer circuits pointed to by the store data tag obtained from the memory control circuit. In one aspect of the computer program product, the data buffer circuits push incoming data into the data buffer circuits upon receiving the write-to-buffer command. In a further aspect of the computer program product, the data buffer circuits receive the data over the link between the Host and the data buffer circuits, but no store data tag is received from the Host over the link between the Host and the data buffer circuits. In one embodiment of the computer program product, the method further comprising sending a store command from the memory control circuit to the memory devices; sending the store-from-buffer command along with the store data tag to the data buffer circuits; and sending data from the location pointed to in the data buffer circuits by the store data tag; and sending the store data tag obtained from the memory control circuit to the memory devices. In another aspect of the computer program product the data buffer circuit receives the data store tag over the link between the memory control circuit and the data buffer circuit. In a further aspect of the computer program product, the method further comprising the step of pushing the store data tag back to the host.

BRIEF DESCRIPTION OF THE DRAWINGS

The various aspects, features and embodiments of the memory system, architectural structure and its method of operation will be better understood when read in conjunction with the figures provided. Embodiments are provided in the figures for the purpose of illustrating aspects, features and/or various embodiments of the memory system, architectural structure and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

FIG. 5 shows the command and address frame sent over a communications link between the Host and a memory control circuit in accordance with one embodiment.

FIG. 6 shows a data frame sent over a communications link from Host to a data buffer circuit in accordance with an embodiment.

FIG. 7 shows a frame sent over a communications link from a memory control circuit to the Host in accordance with one embodiment.

DETAILED DESCRIPTION

Figure 1:
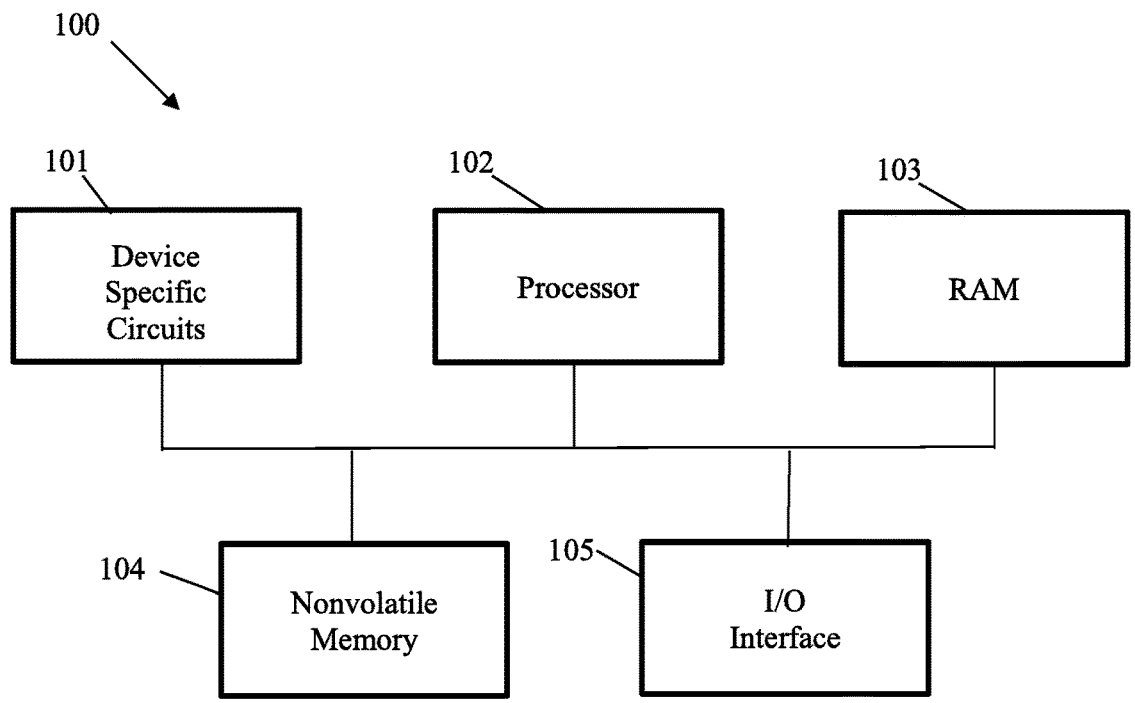
FIG. 1 depicts a general computing or data processing system in accordance with one embodiment.

The following description is made for illustrating the general principles of the invention and is not meant to limit the inventive concepts claimed herein. In the following detailed description, numerous details are set forth in order to provide an understanding of the memory system, architectural structure and method of operation, however, it will be understood by those skilled in the art that different and numerous embodiments of the memory system, architectural structure and method of operation may be practiced without those specific details, and the claims and invention should not be limited to the embodiments, subassemblies, features, processes, methods, aspects, features of details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

Memory systems, memory architecture, and/or methods of performing read/write operations in a memory system or subsystem, including, for example, a distributed memory system, are disclosed. In one embodiment, a memory system, architectural structure, and/or method of storing and/or fetching data in memory systems, including memory devices, is disclosed. The memory system as disclosed in more detail below may include one or more memory devices, and one or more data buffer circuits. The memory system may further include a memory control circuit, which may in one embodiment include a memory controller to control the flow of data going to and from the memory devices. There may be communication links or buses for transferring data, commands, responses, and/or signals between the Host, the memory devices, the data buffer circuits, and/or the memory control circuits.

In one aspect, the memory system, architectural structure, and/or method for performing read/write operations improves the data bandwidth on the communication link between the Host and data buffer circuits. In one embodiment, a memory system, architectural structure, and/or method of storing write data to the data buffer circuit is disclosed. In one aspect, a memory system, architectural structure and/or method of managing store data at the data buffer circuit is disclosed. In one embodiment, the disclosure provides a system, architectural structure, and/or method for the data buffer circuits to put store data into their write buffer. In one aspect, a memory system, architectural structure, and/or method is disclosed where the Host sends the store data tag to the memory control circuit.

In one embodiment, a memory system, architectural structure, and/or method to store write data in a data buffer circuit is described which improves the data bandwidth between the Host and data buffer circuit. In an embodiment, a memory system, architectural structure and/or method of storing information or data is disclosed where the Host sends the write buffer tag to the memory control circuit and the AC sends the write buffer tag to all the DC chips. In one embodiment the Host sends and only the memory control circuit receives from the Host the store data tag, and the Host sends the data to the data buffer circuits after a configurable or programmable delay. In an embodiment of a memory system, architectural structure, and/or method of storing data, the memory control circuit receives the store command from the Host and the memory control circuit sends a write-to-buffer command and store data tag to all the data buffer circuits, but no write to buffer tag is sent over the downstream link between the Host and the data buffer circuits. In one embodiment, the memory system, architectural structure and/or method of storing information and data includes a distributed memory system having a module containing a memory control circuit, a plurality of data buffer circuits, and a plurality of memory devices, and in one example may contain one AC chip, nine data chips, and a plurality of memory device chips arranged in groups of nine (e.g., 9, 18, 27, 36, etc.) preferably as a DIMM.

A computing or data processing system 100 suitable for storing and/or executing program code may take many forms and in one embodiment may include at least one processor 102, which may be or be part of a controller, coupled directly or indirectly to memory devices or elements through a system bus, as shown in FIG. 1. Computing system 100 in FIG. 1 is shown with a processor 102, Random Access Memory (RAM) 103, nonvolatile memory 104, device specific circuits 101, and I/O interface 105. Alternatively, the RAM 103 and/or nonvolatile memory 104 may be contained in the processor 102 as could the device specific circuits 101 and I/O interface 105. The processor 102 may comprise, for example, an off-the-shelf microprocessor, custom processor, Field Programmable Gate Array (FPGA), Application Specific Integrated Circuit (ASIC), discrete logic, etc. The RAM 103 is typically used to hold variable data, stack data, executable instructions, etc., and may include Dynamic Random Access Memory or DRAM.

According to various approaches, the nonvolatile memory 104 may comprise any type of nonvolatile memory such as, but not limited to, Electrically Erasable Programmable Read Only Memory (EEPROM), flash Programmable Read Only Memory (PROM), battery backup RAM, hard disk drives, etc. The nonvolatile memory 104 is typically used to hold the executable firmware and any nonvolatile data containing programming instructions that can be executed to cause the processor 102 to perform certain functions.

In some embodiments, the I/O interface 105 may include a communication interface that allows the processor 102 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The computing system 100 may communicate with an external device via the communication interface 105 in any communication protocol such as Automation/Drive Interface (ADI).

Figure 2:
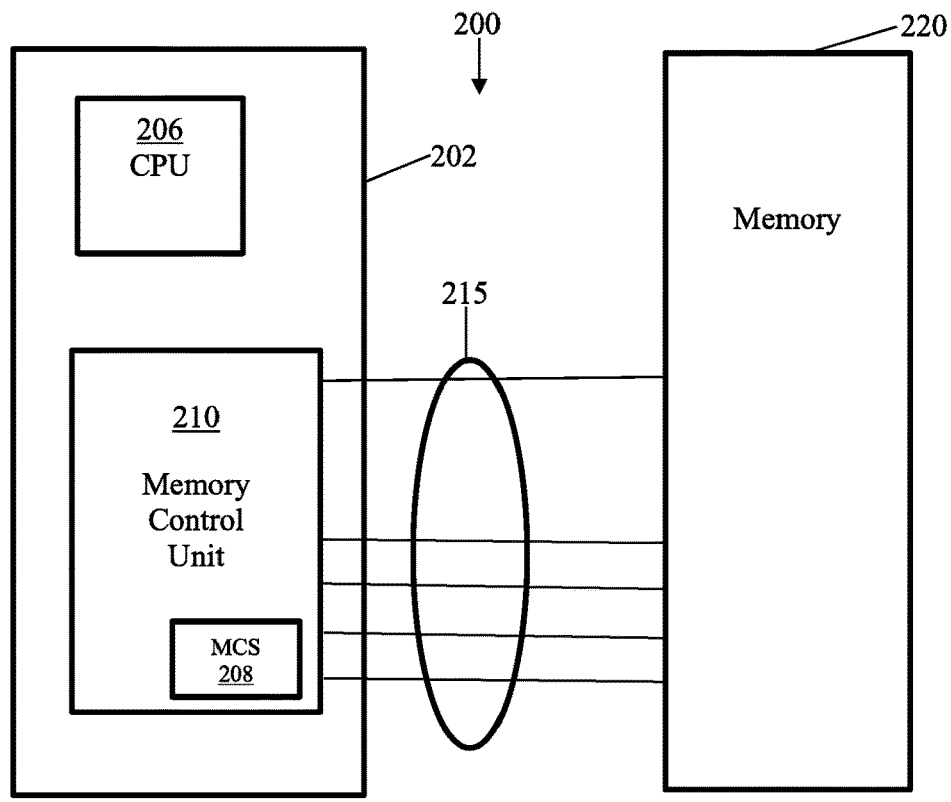
FIG. 2 depicts a memory subsystem in accordance with an embodiment.

FIG. 2 depicts an exemplary memory system 200 that may be part of a larger computer system structure or network. The computer system 200 includes a control processor system 202, which is a processing subsystem that includes at least one processor unit (CPU) 206 that may be configured to interface with a Memory Control Unit (MCU) 210. The processor or CPU 206 may be a module that processes read, write, and configuration requests from a system controller (not depicted). The processor 206 may be a multi-core processor. The MCU 210 may include a memory controller synchronous (MCS) 208, also referred to as a memory controller, that controls communication with one or more memory devices 250 (not shown in FIG. 1) in a memory subsystem 220. The MCU 210 and the MCS 208 may include one or more processing circuits, or processing may be performed by or in conjunction with the processor 206. The control processor system 202 communicates with the memory subsystem 220 through a communications bus 215 as will be described in more detail in connection with FIG. 4. Control processor system 202, processor or CPU 206, memory control unit 210, and MCS 208, individually and collectively, may be referred to herein as the Host. The Host as used herein is used broadly to refer to a processor, controller or device that sends and receives command and/or control signals to a memory system or subsystem. The Host may also send and receive data signals from a memory system or subsystem.

Figure 3:
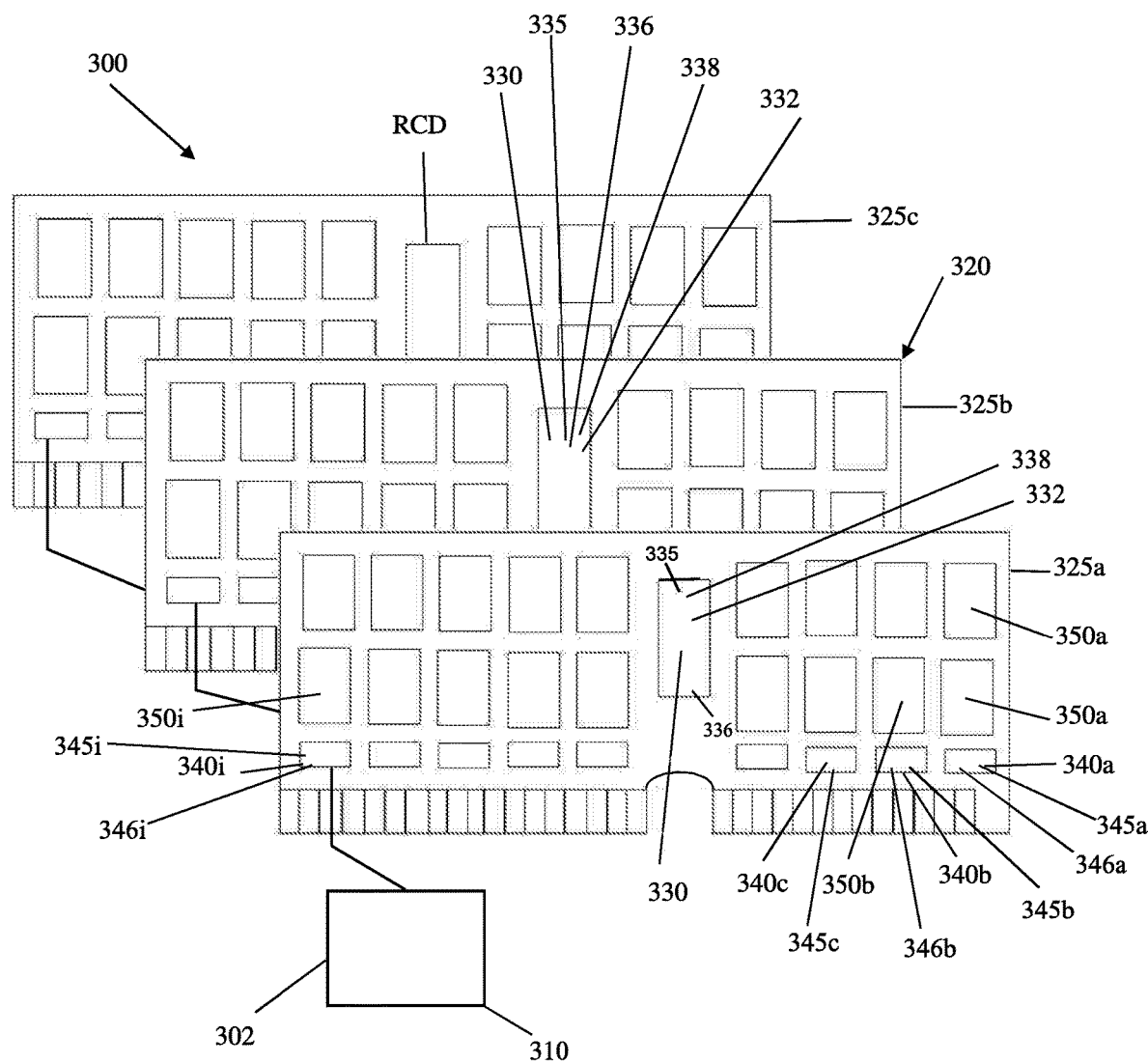
FIG. 3 depicts a memory subsystem including a buffered DIMM configuration in accordance with an embodiment.

FIG. 3 depicts an example of a memory subsystem 320. Memory system 320 comprises a plurality of memory modules, e.g., Dual Inline Memory Modules or DIMMs 325. While only three (3) DIMMs 325a-c are shown in FIG. 3, it will be appreciated that memory subsystem 320 may contain more are less DIMMs 325. The DIMMs 325 may be arranged in channels and ranks, with one or more DIMMs 325 per channel or rank. Each DIMM 325 may contain one or more volatile memory devices, e.g., Dynamic Random Access Memory chips or DRAMs 350. The memory devices 350 may be integrated circuits or chips and form the basic memory cells that hold bits of information. The memory cells in a memory device, e.g., DRAM, are usually arranged in banks, where each bank is an array of rows and columns.

The memory subsystem may also include one or more memory control circuits 330, one or more data buffer or data (DC) circuits or (DC) chips 340, and one or more memory devices 350. The memory control circuit manages the flow of data going to and from the memory devices. The memory control circuit typically receives signals such as command and control signals from a Host, e.g., a Host processor. The control signals may include address locations or tags on where to store data in the memory devices and/or data buffer circuits. The memory and control circuit may output command and control signals to the memory devices. The memory control circuits 330 for ease of reference may also be referred to as address and command circuits, AC circuits or AC chips. The memory control circuit 330 may or may not have a Registered Clock Driver or RCD. The memory control circuit 330 in one embodiment may have a memory controller. The memory control circuit 330 or memory controller 332 may have a scheduler 338. The memory control circuit 330, memory controller 332 and/or scheduler 338 may optimize the order of operations and instructions, and sends out signals to the data buffer circuits and the memory devices. The memory control circuit 330/memory controller 332/memory scheduler 338 may reorder the sequence of operations. The memory control circuit may or may not be located on the board or module, e.g., DIMM, with the memory devices. In embodiments, as shown in FIG. 3, the memory control circuits 330 are formed as an integrated circuit or chip and are located on the module 325 with the memory devices 350. In one embodiment, the memory control circuit may be remote from the Host processor.

The data buffer circuits 340 buffer, receive, transmit, and/or transfer data between the Host, e.g., control processor system 302, and the memory devices 350. The data buffer circuits may or may not be located on the same board or module, e.g., DIMM, as the memory devices and/or the memory control circuits. The data buffer circuits 340 in one embodiment are also formed as integrated circuits or chips and are located on the module 325 with the memory devices 350. The data buffer circuits may also be referred to as data circuits, DC circuits, and/or DC chips.

In the example of FIG. 3, a distributed memory system 300 is illustrated having a memory control processor 302 and/or memory control unit 310, and a memory subsystem 320. The memory control unit 310, and/or memory control processor 302, may be a Host. The memory or data storage system 320 may be configured to store data and to provide storage services to one or more Hosts, which can be connected to the storage system 320 directly or through a network (e.g., over the internet). The storage system may include an interface for supporting communications with the Host.

In the embodiment of FIG. 3, the memory subsystem 300 has three (3) DIMMS 325a-c. The distributed memory system 300 may have one or more control processors systems or Hosts 302, and may have more or less DIMMs 325. In the distributed memory system 300 of FIG. 3, each memory module 325 is configured as a DIMM and has one memory control circuit or AC chip 330, nine (9) data buffer circuits or DC chips 340, and thirty-six (36) memory devices 350, e.g., DRAMs. The memory control circuit is configured and programmed to send command and control signals to the data buffer circuits and the memory devices. Each memory control chip or AC chip 330 in this example manages the flow of data to and from the memory devices on the module 325. Each data buffer circuit or DC chip 340 in this example interacts with and buffers data between four memory devices 350. The DIMMs may include memory devices, e.g., DRAMs, preferably in groups of nine, e.g., 9, 18, 27, 36, etc.

Other configurations are contemplated for the memory module 325, and for the memory subsystem 320. Typically there is one memory control chip 330 per nine or ten data buffer chips 340. As an example, a DDR4 memory system may include a memory control circuit or AC chip and a group of nine (9) data buffer circuits or DC chips. While the memory device structure and/or module of FIG. 3 shows the memory devices 350 in groups of nine, it is contemplated that the memory devices may be arranged in groups of ten or more. In the example of FIG. 3, one AC chip per DIMM is illustrated, although more AC chips per DIMM may be used. The memory system architecture may be formatted and structured to support DDR4 and DDR5 standards, although the methods, systems and architecture disclosed and taught would be applicable to other configurations, including future standards.

In one example, the data buffer circuits or DC chips 340 may each have a write buffer array that is used to hold store operations from the Host processor 302 (memory control unit 310) until the memory controller 332 on the memory control circuit 330 can schedule them. There are communication buses or links between the Host 302 and the memory control circuit 330 and between the memory control circuit 330 and the memory devices 350. There is also a data communications link or bus between the Host 302 and the data buffer circuits 340, and a communications link or bus between the data buffer circuits 340 and the memory devices 350. There may be a communication link or bus 332 from the memory control circuit 330 to the data buffer circuits or DC chips 340. The communication link or bus between the memory control circuit 330 and the data buffer circuits 340 may be a one way broadcast communication link or bus called BCOM. More information on specific embodiments of the communication buses and links will be described below.

The bandwidth of the communication links impact performance of the memory system 300. In one or more embodiments, the memory system, architectural structure, and/or method of operation provide improvements in storing and/or retrieving data between a Host and one or more memory devices. In one embodiment, a memory system, architectural structure, and/or method is disclosed to improve the performance and/or bandwidth available for data on the communication link between the Host 302 and the data buffer circuit or DC chip 340. In one embodiment, the bandwidth of the communications link between the Host 302 and the data buffer circuit 340 is improved by decreasing the frequency of (or eliminating) control information (tags) being sent from Host 302 to the data buffer circuit or DC chip 340 over the communications link between the Host 302 and the data buffer circuit 340.

In one embodiment, the bandwidth of the downstream communications link between the Host and the data buffer circuit 340 is improved by not sending write buffer tags over the link between the Host and the data buffer circuits and only sending data. To reduce demand on the link between the Host and DC chips 340, in one embodiment of performing a store operation, the Host 300 sends a store command and store data tag to the memory control circuit (AC chip) 330, and the AC chip 330 sends the store data command to the DC chip 340, and a corresponding store data tag to the DC chip 340. In one embodiment, the Host sends and the AC circuit receives a store command and a store data tag and the AC circuit processes the store command into a write-to-buffer command and a store-from-buffer command, and sends the write-to-buffer command and store data tag to the DC circuit; and also sends later, after the store-from-buffer command is scheduled, the store-from-buffer command and the same store data tag to the DC circuit. In one embodiment, the Host sends to only the AC chip the store data tag (Host does not send store data tag to the DC chip over the communications link between the Host and DC chip), which indicates where in the data buffer circuit to store data, and the AC chip sends the store data tag to all the DC chips over the communications link, e.g. a BCOM link, between the AC chip and the DC chip, and the DC chip uses the store data tag to identify the location/address in the data buffer to store the incoming data from Host (sent to DC chips preferably after a programmable delay over the communications link between Host and DC chips).

Figure 4:
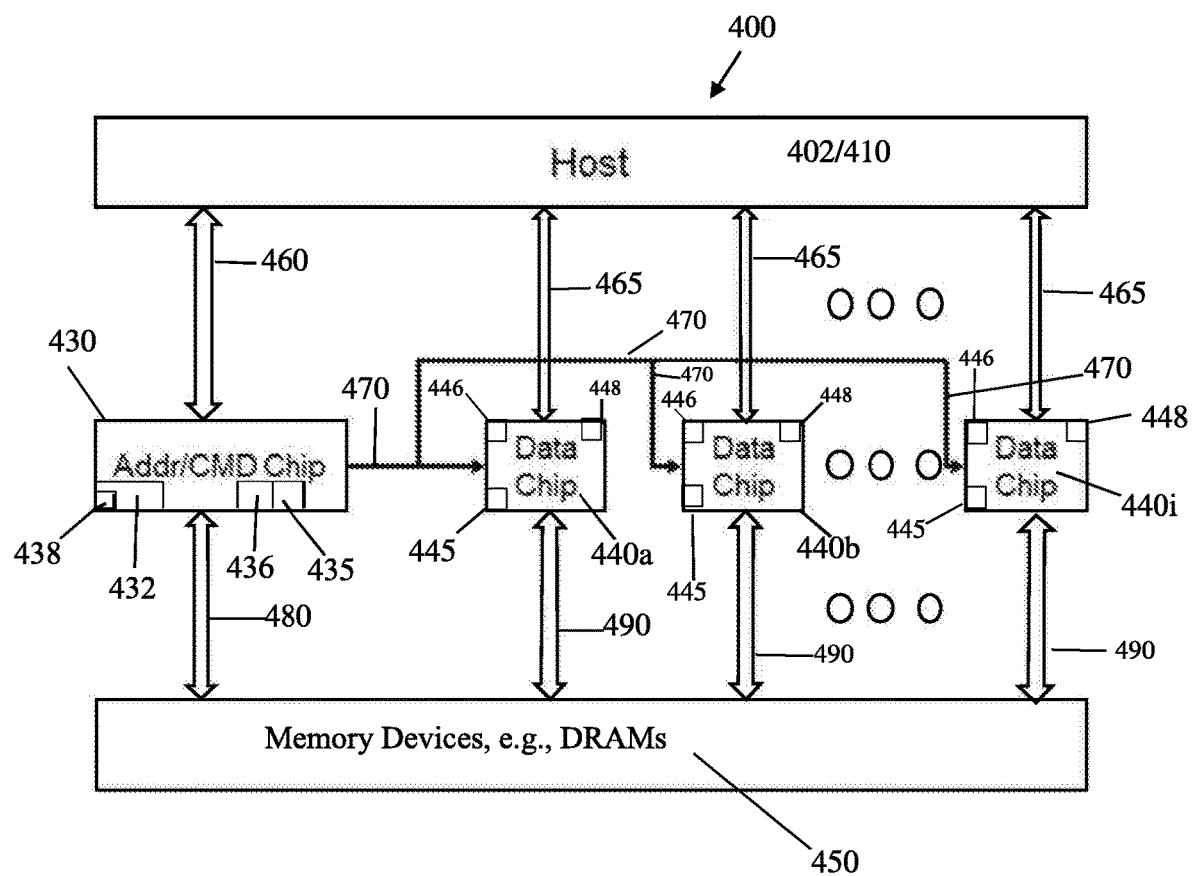
FIG. 4 diagrammatically depicts a distributed buffer memory system in accordance with one embodiment.

FIG. 4 illustrates a schematic illustration of a distributed buffer memory system 400 according to one embodiment. The system includes a plurality of memory devices 450, e.g. DRAMs. The DRAMs may be arranged on a module, usually a DIMM 325. The system 400 may have one or more DIMMs. The system may further include one or more memory control circuits or AC chips 430, and one or more data buffer circuits or DC chips 440. In one embodiment, each DIMM may include one memory control circuit or AC chip 430 and a plurality of data buffer circuits or DC chips 440 (9 or 10 chips per AC chip). Each DIMM 325 may have memory devices, e.g., DRAMs 450, arranged and configured in groups of nine, e.g., nine (9), eighteen (18), twenty-seven (27), thirty-six (36) or more. The DIMMs may have an unequal number of memory devices, e.g., DRAMs 450. In one embodiment, the system is designed to support DDR4 or DDR5 memory systems, although other configurations and arrangements are contemplated. The memory control circuit 430 may or may not have a Regulated Clock Driver, and in one embodiment, the memory control circuit 430 may have a memory controller 432 and/or a memory scheduler 438.

Link 460 diagrammatically illustrated in FIG. 4 is a differential High Speed Serial (HSS) bus with eight (8) lanes from the Host 402/410 to the memory control circuit or AC chip 430 for sending commands to the memory subsystem 320 and one HSS lane back for reporting stats such as operations that are complete, or error notification and detail. FIG. 5 shows one example of the address and command frame sent over link 460 from Host 402/410 to memory control circuit or AC chip 430. In FIG. 5, the address and command frame has two (2) bits (L0-L1) to specify the number of memory cycles to make up a frame; thirty-nine (39) bits of addressable space A0-A38; four (4) bits of space for commands (C0-C3); seven (7) bits Q0-Q6 for the tagfield match sent to the DC chips for write operations; one bit (ACK) for acknowledge for the upstream frame; and eleven (11) bits P0-P10 for Cyclic Redundancy Check (CRC) code provided for lane error isolation.

Link 465 is a HSS bus with two (2) lanes from the Host 402/410 to each data buffer circuit or DC chip 440 for store data and two (2) lanes from each DC chip 440 to the Host 402/410 for fetch data. For mainline operations, link 465 in an embodiment is used only for transmitting data and the required cyclic redundancy check (CRC) for protecting that data. The bandwidth of link 465 in one embodiment is not consumed with any kind of control information and may not have any bandwidth consumed for response information. All two lanes of bandwidth for link 465 is used in an embodiment to transmit data (and CRC). FIG. 6 shows one example of a data frame for Host 402/410 to DC chip 440 communication over link 465. In FIG. 6, 128 bits (D0-D127 in memory cycles (frames) 1-8) are data fields; and sixteen (16) bits (CRC0-CRC15) in memory cycle (frame) 9) is for CRC, so that nine (9) out of nine (9) or 100% of the bandwidth of link 465 is used to transmit data and CRC. By not using link 465 for transmitting control signals, e.g., tag or address locations, all nine (9) memory cycles are used for transmittal of data and CRC, which improves data transfer efficiency in link 465.

Link 470 is a broadcast (BCOM) bus from the memory control circuit or AC chip 430 to the data buffer circuits or DC chips 440 used to notify the DC chips when to execute the scheduled operations. For fetch operations only a command is sent over link 470 from the AC chip 430 to the DC chip 440. According to one aspect, for store operations the control memory circuit 430 processes, decodes, or cracks a store command into two suboperations called "write buffer" or "write-to-buffer," which writes data from the Host 402/410 into the data buffer on the DC chips 440, and "store buffer" or "store-from-buffer," which stores data from the DC chips 440 to the memory devices 450, e.g., DRAMs. For a write buffer, in one embodiment, a command is sent to the data buffer circuits or DC chips 440 from AC chip 430 over link 470, and a control signal, e.g., a location tag address, is sent to the data buffer circuit. For a store buffer operation, both a command and control signal, e.g., a write buffer address, is sent to the data buffer circuit or DC chips 440. Operation of the memory subsystem will be described in more detail below.

There is also an Error ATTN network 475 between the memory control circuit 430 and the data buffer circuits or DC chips 440 that may transmit an Error ATTN signal from the data buffer circuits or DC chips 440 notifying the memory control circuit or AC chip 430 that a DC chip 440 took an error that requires reporting to the Host 402/410. The Error ATTN netework may be a wired OR open drain circuit. Note that the DRAM ATTN signal that indicates a memory device 450, e.g., DRAM, took an error is routed from the memory device 450 back to its DC chip 440 instead of routing them directly back to the AC chip 430. The AC chip 430 must report this error to the Host 402/410 since the DC chips 440 have no response or control information in their upstream frame. The DC chip 440 forwards the memory device errors back to the AC chip 430 via link 470, but each DC chip 440 has knowledge that one of its memory devices, e.g., DRAMs 450, took an error. The AC chip 430 routes the error signal back to the Host. The Host 402/410 may invoke its error recovery routine, and non-mainline operations from the Host 402/410 can be used to read the status registers of the DC chips 440. The Host 402/410 is then able to isolate which DC chip 440 took the error, if the error occurred on the HSS link or was an ATTN from one of its memory devices, or if it was some other error occurring on the DC chip 440. The Host 402/410 may then take action as desired to recover from the error.

Link 480 is the command and address bus from the memory control circuit or AC chips 430 to the memory devices 450, e.g. DRAMs. Links 490 are the memory devices data buses used by the DC chip 440 to send store data to the memory devices and receive fetch data from the memory devices 450. Communication link 490 also receives the memory device ATTN signal.

Turning now to the operation of a memory system, during normal operations the Host 402/410 sends a store command to the memory control circuit or AC chip 430. The store command sent by the Host to the AC chip 430 may be processed, decoded, or cracked by the AC chip 430 into a "write buffer" command, which writes data from the Host into the data buffer on the DC chips 440, and a "store buffer" command, which stores data from the DC chips 440 to the memory devices 450. The "write buffer" command is scheduled for execution right away, and the "store buffer" command is scheduled for execution by the memory control circuit based on optimizing system performance.

The write buffer command is sent by the memory control circuit or AC chip 430 to the data buffer circuit or DC chips 440 over link 470 and the Host 402/410 sends data to be stored to the DC chips 440 over link 465, preferably after a configurable delay. In one embodiment, the AC chip sends an address, tag or location (e.g., a store data tag) to the DC chip 440 identifying where the store data should be located in the write buffer of the data buffer circuits 440. Each DC chip 440 can check the CRC codes from the store data received to verify that an error did not occur over the HSS link 465. If an error is found to have occurred, the DC chip 440 notifies the AC chip 430 via the Error ATTN signal over link 475 that an error has taken place and the error is recorded in the DC chip's status register 448.

The AC chip 430 may include a scheduler 438 that optimizes the order of operations and system instructions and sends out commands. The scheduler 438 can reorder operations. The AC chip scheduler 438 may schedule the "store buffer" command when it is optimal for system performance to execute that operation. Bank collisions, periodic operations, and fetch commands can cause a store operation to be delayed to allow other operations to complete or execute ahead of it. Once the "store buffer" operation completes the store operation, the Host store command is considered complete, and the AC chip 430 sends an upstream frame to the Host via link 480 using as an example the format in FIG. 7 to indicate which operations completed.

In one embodiment, fetch operations start with the fetch command being sent to the AC chip 430 via communications link 460 because there is no need to send data ahead of time. Fetch operations may be prioritized in the system and if the buses are available for use, a fetch operation will bypass store operations in the queue to minimize latency. If, however, there are other pending fetch operations that need to be scheduled, the fetch operation will enter the memory control circuit scheduler 438.

Once the memory control circuit memory scheduler 438 schedules the fetch operation to execute, the command signal and control signal, e.g., address (tag), is sent from the AC chip 430 over link 480 to the memory devices 450 and the DC chips 440 are informed by the AC chip 430 over link 470 that fetch data will arrive to be sent to the Host 402/410 in a fixed number of cycles. Once the fetch data arrives at the DC chips 440, the data is forwarded directly to the Host 410/402 over link 465. Fetch data preferably is not buffered as this would create additional latency. The AC chip 430 will then send an upstream frame to the Host notifying it that the fetch operation has completed.

The response frame indicating which operations are completed is shown in FIG. 7. In FIG. 7, two (2) bits (T0-T1) is the frame/type identifier; two (2) bits (R0-R1 (op1)) identifies the response type, e.g., store done, fetch complete, or attention response, for a first operation; seven (7) bits (Q0-Q6 (op1)) is the Command Queue Tag associated with the response type of the first operation; two (2) bits (D0-D1 (op1)) provides the frame offset code for a first operation (to specify when fetch data will return with respect to the beginning of the four (4) memory cycle frame); six (6) bits (CRC0-CRC5) is the CRC for the frame; and one bit (ACK) is the acknowledge for the downstream frames (e.g., acknowledgment for frame in FIG. 5 received by AC). For a store done response type operation, Q0-Q6 denotes the store done tag, whereas for a fetch completion response type operation, Q0-Q6 denotes the data tag associated with fetch data. When the operation is an attention (ATTN) response, one or both command queue tag fields may be overloaded to convey recovery and status error information back to Host. The response type fields R0-R1, the Command Queue fields Q0-Q6 and the frame offset fields D0-D1 have two operation fields—op1 and op2—and the fields for the second operation (op2) have the same definition as the fields for the first operation (op1). To optimize bandwidth, completion information may be sent for two operations at a time. Opt is used to allow the AC to return two operations responses per frame (i.e., one store done operation and one fetch completion operation, two store done operations, or two fetch completion operations). The response frame sent by the AC chip to the Host when reporting error conditions would be different then FIG. 7.

Figure 8:
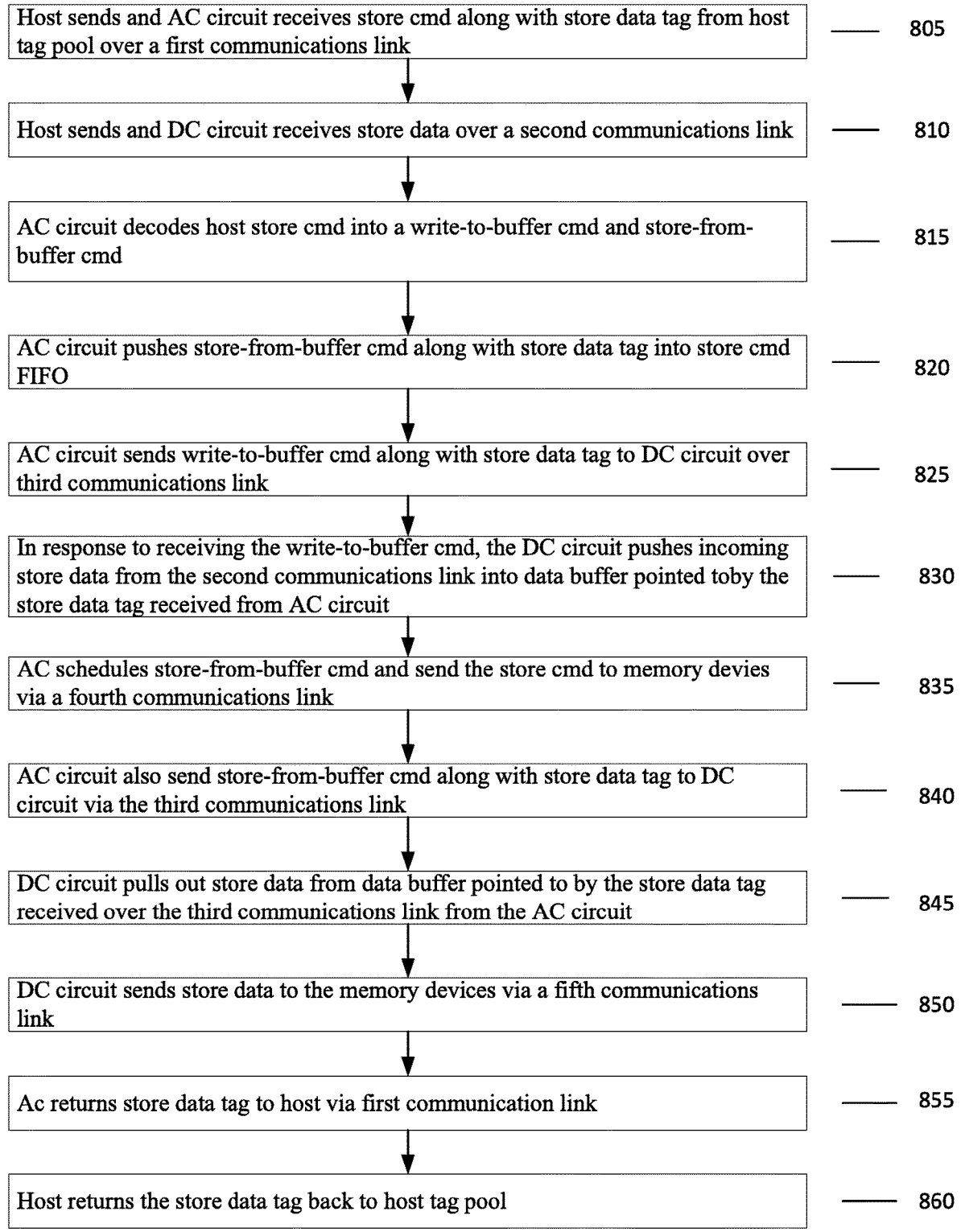
FIG. 8 depicts a flow diagram of a method of performing a store operation in accordance with one embodiment.

Further details of the operation of a memory system, including in certain embodiments distributed memory buffer systems, will be described. FIG. 8 is an exemplary flowchart in accordance with one embodiment illustrating and describing a method of storing data in a memory system, including a distributed buffer memory system, in accordance with one embodiment of the present disclosure. While the storing method 800 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 8, but the process may be integrated and/or one or more steps may be performed together, simultaneously, or the steps may be performed in the order disclosed or in an alternate order.

At 805, a Host (e.g., processor, memory controller, etc.) sends and a memory control circuit, e.g., an AC chip 430, receives a store command along with a store data tag from the Host tag pool. The store command and store data tag is preferably transferred, via a first communications link, e.g., link 460 in FIG. 4. The store data tag from the Host tag pool correlates with and identifies the host store command. For ease of reference, the memory control circuit may be referred to as an AC circuit or AC chip in this discussion and in FIG. 8. At 810, the Host sends and the data buffer circuit, e.g., DC circuit, receives data to be stored via a different, second communications link, e.g., link 465 in FIG. 4. For ease of reference, the data buffer circuit may be referred to as a DC circuit or DC chip in this discussion and in FIG. 8. In one embodiment, no control signal, e.g., address tag, is sent over the communication link between the Host and the data buffer circuits. Only data in this embodiment is sent over the communication link (e.g., link 465 in FIG. 4) between the Host and the data buffer circuits. The data to be stored may be sent to the DC circuit after a configurable (or programmable) delay. The delay may be a configurable or programmable fixed delay. By not sending an address tag over link 465, the ability or efficiency of link 465 to transmit data may be increased.

The AC circuit at 815 processes, decodes, or cracks the Host store command into a write-to-buffer ("write buffer") command and store-from-buffer ("store buffer") command. At 820, the AC circuit 430 may push the store-from-buffer command along with the store data tag received from Host into store command FIFO (buffer in the AC scheduler) such that this command can be scheduled later by the scheduler. At 825, the AC circuit 430 sends the write-to-buffer command along with the store data tag to the DC circuit 440 via a third communications link, e.g., link 470 in FIG. 4. In other words, the store data tag (or Host tag) sent by the Host for a store command is forwarded to all the DC circuits from the AC circuit. In this manner, the store data tag sent to the DC circuits is associated with the command and store data tag received from the Host.

In response to and preferably upon receiving the write-to-buffer command, at 830, the DC circuit 440 pushes incoming data to be stored from the second communications link, e.g., link 465 in FIG. 4, into the data buffer pointed to by the store data tag received from the memory circuit 430. The DC circuit 440 may push the data into its buffer after a configurable delay.

At 835, the AC circuit 430 schedules the store-from-buffer command and sends the store command to the memory devices 450 via a fourth communications link, e.g., link 480 in FIG. 4. The AC circuit 430 at 840 also sends a store-from-buffer command along with store data tag to the DC circuits 440 via the third communications link, e.g., link 470 in FIG. 4. At 845, the DC circuits 440 pull out data to be stored from the data buffer pointed to by store data tag received from the AC circuit 430 via the third communication link, e.g., link 470 in FIG. 4. The store data tag is the same store data tag earlier sent to the data buffer circuit when writing data to the data buffer circuit. At 850, the DC circuits 440 send data to be stored to the memory devices 450 via a fifth communications link, e.g., link 490 in FIG. 4.

At 855, the AC circuit 430 returns the store data tag to Host via the first communications link, e.g., link 460 in FIG. 4. And at 860, the Host returns the store data tag back to the Host tag pool. While FIG. 8 discloses and describes the method as a series of steps it will be appreciated that the order described above and in FIG. 8 may be changed.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for storing data in memory devices, the method comprising:
   processing, by a memory module containing a memory control circuit, at least one data buffer circuit, and the memory devices, a store command in the memory control circuit into a write-to-buffer command and a store-from-buffer command;
   sending the write-to-buffer command and a store data tag from the memory control circuit to the at least one data buffer circuit; and
   pushing incoming data into a location in the at least one data buffer circuit pointed to by the store data tag obtained from the memory control circuit.

2. The method of claim 1, wherein the at least one data buffer circuit pushes incoming data into the at least one data buffer circuit in response to receiving the write-to-buffer command.

3. The method of claim 2, further comprising:
   sending a store command from the memory control circuit to the memory devices;
   sending the store-from-buffer command along with the store data tag to the at least one data buffer circuit; and
   sending data from the location in the at least one data buffer circuit pointed to by the store data tag to the memory devices.

4. The method of claim 3, wherein the at least one data buffer circuit receives the data store tag over a third link between the memory control circuit and the at least one data buffer circuit.

5. The method of claim 3, further comprising the step of returning the store data tag back to a host.

6. The method of claim 3, wherein the data buffer circuit receives the store data tag and the store from buffer command over a third communications link between the memory control circuit and the at least one data buffer circuit.

7. The method of claim 3, wherein the store command is sent from the memory control circuit to the memory devices over a fourth communications link.

8. The method of claim 3, wherein data is sent from the at least one data buffer circuit to the memory devices over a fifth communications link.

9. The method of claim 1, wherein the at least one data buffer circuit receives the incoming data over a second communications link between a host and the at least one data buffer circuit, but no store data tag is received by the at least one data buffer circuit from the host over the second communications link between the host and the at least one data buffer circuit.

10. The method of claim 1, further comprising the memory control circuit receiving the store command and the store data tag from a host.

11. The method of claim 10, wherein the memory control circuit receives the store command and the store data tag from the host over a first communications link.

12. A method for storing data in memory devices, the method comprising:
   receiving a store command along with a store data tag from a host tag pool over a first communications link into a memory control circuit;
   decoding the store command in the memory control circuit into a write-to-buffer command and a store-from-buffer command;
   sending the write-to-buffer command along with the store data tag over a third communications link to the data buffer circuit; and
   in response to receiving the write-to-buffer command, the data buffer circuit receives incoming data over a second communications link into a location in the data buffer circuit pointed to by the store data tag received from the memory control circuit.

13. The method of claim 12, further comprising the memory control circuit pushing the store-from-buffer command with the store data tag into a store command FIFO buffer.

14. The method of claim 13, further comprising sending the store command from the memory control circuit over a fourth communications link to the memory devices, and sending the store-from-buffer command along with the store data tag over the third communications link to the data buffer circuit.

15. The method of claim 14, further comprising moving the data out of the location in the data buffer circuit pointed to by the store data tag and sending the data in response to the data buffer circuit receiving the store-from-buffer command from the data buffer circuit over a fifth communications link to the memory devices.

16. The method of claim 14, further comprising returning the store data tag to the host over the first communications link.

17. The method of claim 16, further comprising returning the store data tag back to the host tag pool.

18. A method for storing data in memory devices, the method comprising:
  receiving a store command along with a store data tag over a first communications link into a memory control circuit;
  decoding the store command in the memory control circuit into a write-to-buffer command and a store-from-buffer command;
  sending the store-from-buffer command along with the store data tag into a store command FIFO buffer;
  sending the write-to-buffer command along with store data tag from the memory control circuit over a third communications link to the data buffer circuit;
  in response to receiving the write-to-buffer command, the data buffer circuit receives incoming data over a second communications link into a location in the data buffer circuit pointed to by the store data tag received from the memory control circuit; and
  sending the incoming data from the location in the data buffer circuit pointed to by the store data tag over a fifth communications link to the memory devices.

19. The method of claim 18, further comprising the memory control circuit scheduling the store-from-buffer command and sending the store command to the memory devices over a fourth communications link, and sending the store-from-buffer command along with the store data tag to the data buffer circuit over the third communications link.

20. The method of claim 19, further comprising the data buffer circuit, in response to receiving the store-from-buffer command, sending the incoming data from the data buffer circuit to the memory devices.

* * * * *